United States Patent
Kular

(10) Patent No.: US 6,670,540 B2
(45) Date of Patent: Dec. 30, 2003

(54) PHOTOVOLTAIC STRIP ASSEMBLY

(75) Inventor: Andrew C. Kular, Riverside, NJ (US)

(73) Assignee: Ecosol Solar Technologies Ltd., Trenton, NJ (US)

( * ) Notice: Subject to any disclaimer, the term of this patent is extended or adjusted under 35 U.S.C. 154(b) by 0 days.

(21) Appl. No.: 09/974,652

(22) Filed: Oct. 10, 2001

(65) Prior Publication Data

US 2003/0066556 A1 Apr. 10, 2003

(51) Int. Cl.$^7$ .................. H01L 31/045; H01L 31/048
(52) U.S. Cl. ................ 136/245; 136/244; 136/251
(58) Field of Search ................... 136/244, 245, 136/246, 251, 256, 259; 257/433, 436, 443, 466

(56) References Cited

U.S. PATENT DOCUMENTS

| | | | | |
|---|---|---|---|---|
| 3,977,904 A | * | 8/1976 | Kohler | 136/246 |
| 5,605,769 A | | 2/1997 | Toms | 429/9 |
| 6,307,145 B1 | * | 10/2001 | Kataoka et al. | 136/251 |
| 6,380,710 B1 | * | 4/2002 | Watanabe et al. | 320/101 |

FOREIGN PATENT DOCUMENTS

JP          63-117472          5/1998

* cited by examiner

*Primary Examiner*—Nam Nguyen
*Assistant Examiner*—Brian L Mutschler
(74) *Attorney, Agent, or Firm*—Synnestvedt, Lechner & Woodbridge, LLP; Richard C. Woodbridge, Esq; Thomas J. Onka, Esq

(57) ABSTRACT

A photovoltaic strip assembly is disclosed comprising a polyimide substrate, a thin film voltaic strip, and a transversely grooved, protection covering of a chlorofloural polymer. The grooves are provided to increase the flexibility of the strip, and may be V-shaped, flat bottomed with splayed sides, or rounded to provide dome shapes between them. Similar grooves may be provided in the exposed surface of the substrate to further increase the flexibility of the strip. The grooves of the substrate may be aligned with ridges between the grooves of the protective covering, to receive these ridges when the strip is wound around a rechargeable battery or energy cell. In a different embodiment the grooves are between rows of hump-shaped protuberances. The protuberances of adjacent rows may be staggered.

11 Claims, 5 Drawing Sheets

PHOTOVOLTAIC STRIP ASSEMBLY

FIELD OF THE INVENTION

This invention relates to a flexible photovoltaic strip assembly which may be rolled up for storage.

BACKGROUND OF THE INVENTION

Although photovoltaic power cells have been known in the art since the 1950's, a drawback to the use of these cells is the fact that they can not be easily stored when not in use.

Japanese Publication No. JP363117472A, publication date May 21, 1998, "Portable Solar Bell Power Source", Yanagihara and Z. Ito, describes a power source which can be stored by winding a long, flexible, thin film solar cell onto a winding shaft and placing the wound film in a package.

Further, U.S. Pat. No. 5,605,769, issued Feb. 25, 1997 to D. J. Toms and entitled "Method and Apparatus for Supplying Electrical Energy to Battery Powered Equipment" discloses an assembly to supply electrical energy to, for example, a rechargeable battery by unfurling, i.e. unwinding, a flexible strip of photovoltaic cells to form a flat surface for exposure of light.

While these devices are useful, there is a drawback in that,
i) if the light converting strip is bent to be coiled, for example, around a rechargeable battery or energy cell, performance degradation in the conversion of light to electricity is likely to occur because of the repeated bending and unbending of the energy cell, particularly when the strip has been coiled and recoiled a number of times, and
ii) coiling the strip around a small diameter such as that of a rechargeable battery or energy cell can produce a permanent set in the strip so that it will not lie flat, in the uncoiled state, for exposure to light.

This invention addresses the need for a photovoltaic strip device which is less likely to suffer performance degradation when coiled and uncoiled, and which is less likely to incur a permanent set when coiled around a small diameter battery or energy cell.

SUMMARY OF THE INVENTION

Briefly described, the invention comprises a photovoltaic strip assembly with,
a) a flexible strip substrate of polymeric material,
b) a thin film, voltaic strip bonded to the substrate, and
c) a flexible, substantially transparent, protective covering of polymeric material bonded to the voltaic strip, where the outer surface of the protective covering has a series of transverse, weak joint forming, grooves extending across it.

In this specification rechargeable energy cell includes various rechargeable chemical electron storage media, as well as capacitor and super-capacitor materials and hybrids thereof.

In the preferred embodiment, the depth of the grooves does not exceed 80% of the maximum thickness of the protective covering.

In some embodiments of the present invention, the outer surface of the substrate has a series of transverse, weak joint forming grooves extending across it.

In other embodiments of the present invention the grooves are V-shaped grooves.

The grooves of the protective covering, and the substrate, may form ridges between them in the outer surfaces of the protective covering and the substrate, the ridges of the protective covering and the substrate may be truncated, and the ridges of the substrate may be aligned with grooves of the protective covering, so that the ridges of the substrate will enter the grooves of the protective covering, when the assembly is wound into a coil.

In other embodiments of the present invention, the grooves of the protective covering have curved sides to from dome-shaped ridges between them.

Grooves with curved sides may also be provided in the substrate outer surface to form dome-shaped ridges between them.

In some embodiments of the present invention, when the curved-sided grooves are provided in the protective covering, a series of inwardly curving flutes are also provided in the outer surface of the substrate, extending transversely thereacross, and the flutes are aligned with the domes of the protective covering so that the domes will enter the flutes when the assembly is wound into a coil.

Preferably, the flutes have V-shaped notches between them and the domes and the flutes are shaped to provide substantially continuous curved surfaces when the assembly is wound.

In some embodiments of the present invention the grooves of the protective covering, or the protective covering and the substrate are discontinuous, and the discontinuities of adjacent grooves are displaced across the strip.

In other embodiments of the present invention the grooves of the covering, or the covering and the substrate lie between rows of hump-shaped protuberances.

BRIEF DESCRIPTION OF THE DRAWINGS

In the accompanying drawings which illustrate, by way of example, embodiments of the present invention.

DETAILED DESCRIPTION OF PREFERRED EMBODIMENT

During the course of this description, like numbers will be used to identify like elements according to the different views which illustrate the invention.

Figure 1:
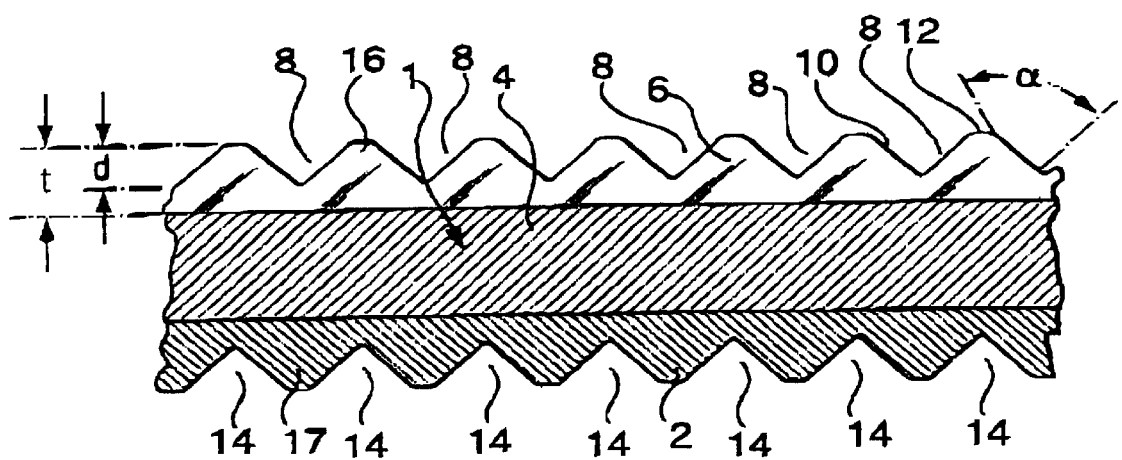
FIG. 1 is an enlarged cross-sectional end view of a portion a voltaic strip assembly.

Referring now to FIG. 1, there is shown a cross-sectional end view of a portion of a voltaic strip assembly generally designated 1, comprising,
a) a flexible strip substrate 2 of polymeric material,
b) a thin film photovoltaic strip 4 bonded to the substrate 2, and
c) a flexible, substantially transparent, protective covering 6 of polymeric material bonded to the photovoltaic strip 4, wherein, the outer surface of the protective covering 6 has a series of transverse, weak joint forming, grooves 8 extending thereacross.

In this embodiment, the depths "d" of each of the grooves 8 does not exceed 80% of the maximum thickness 't' of the protective covering 6.

Further, in this embodiment the grooves 8 have sloping sides 10 and 12 that form an included angle 'α' of 90°. However, in other embodiments the included angle 'α' is preferably greater than about 90°.

In this alternate embodiment, the flexible substrate 2 is also provided with grooves 14 which are similar to the grooves 8 but which are preferably displaced, as shown, transversely therefrom along the assembly 1 so that each groove 14 is aligned directly beneath a triangular ridge, such as that designated 16, between the grooves 8 of the protective covering 6.

In this embodiment the grooves 8 and 14 are V-shaped and the triangular ridges, such as 16, are preferably truncated, as shown, to fit in the grooves 14, when the assembly 1 is wound. The ridges such as 17, of the substrate are also triangular and are also truncated.

The protective covering 6 preferably is a chloroflaural polymer, such as, for example, a copolymer of tetrafluoroethylene and ethylene.

This thin film voltaic strip 4 preferably comprises a series of amorphous silicon modules, such as, for example, those described in "Lightweight, Flexible, Monolithic Thin-Film Amorphous Silicon modules on Continuous Polymer Substrate", D. Grimmer et al, Solar Energy, 1996, Vol. 18, pages 205 to 212.

The substrate 2 preferably is a polyimide.

Figure 2:
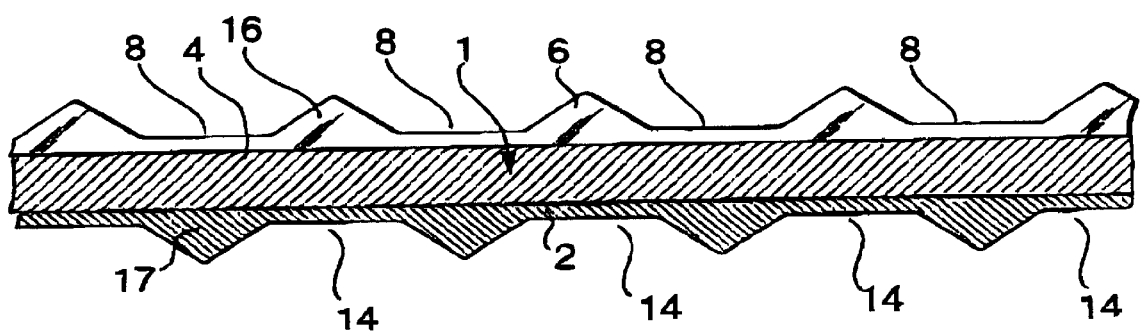
FIG. 2 is a similar view to FIG. 1, but of a different voltaic strip assembly.
Figure 3:
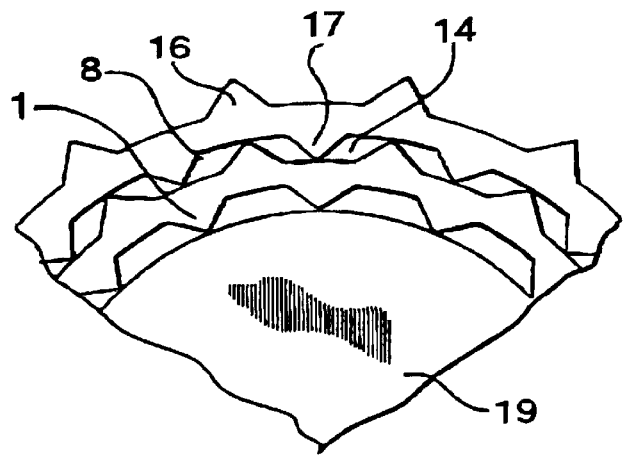
FIG. 3 is an end view of portions of the assembly shown in FIG. 1, wound round a portion of a rechargeable battery.

In FIGS. 2 and 3, similar parts to those shown in FIG. 1 are designated by the same reference numerals, and the previous description is relied upon to describe them.

In this embodiment, the grooves 8 and 14 are shallow-trough-shaped in cross-section to receive the ridges 16 and 17 respectively, at a number of positions thereacross, as shown in FIG. 3, when the assembly is wound around a rechargeable battery or energy cell 19.

In operation, when the assembly 1 of FIG. 1, or of FIGS. 2 and 3, is wound around, for example, a rechargeable battery or energy cell 19, as shown in FIG. 3, the grooves 8 provide weak joints which increase the flexibility of the assembly 1 so that the assembly 1 can be unwound and will not have incurred much of a permanent set, if any.

The grooves 14 will further increase the flexibility of the assembly 1 and further reduce any permanent set in the assembly 1 that may result from the assembly 1 being unwound and rewound a number of times.

The displacement of the grooves 14, across the assembly 1, relative to the grooves 8 is advantageous in that, in the wound condition, triangular ridges, such as 16, will mesh to some extent with the grooves 14 and reduce the bulk of the assembly 1 when it is in the wound condition. To this end, the triangular ridges 16 of the protective coating 6, and the triangular ridges 17 of the substrate 2 may be truncated as shown in FIG. 1.

Forming the grooves 8 and 14 as shallow troughs, as shown in FIGS. 2 and 3, is advantageous in that, as the assembly 1 is wound around the rechargeable battery or energy cell 19, its path gradually increases causing the triangular ridges, such as 16, to be gradually displaced along the grooves 14. This displacement is accommodated by forming the grooves 8 and 14 as shallow troughs.

Typical dimensions for the protective covering 6 are 't' is about 20 mils and 'd' is about 16 mils.

Typical dimensions for the flexible substrate 2 of the overall thickness is about 2 mils and the depths of the grooves are about 0.8 mils.

Preferably the roots of the grooves 8 and 14 are rounded, as shown in FIG. 1, to avoid stress concentrations at these positions.

It should be noted that the assembly 1 may be wound with the protective covering 6 outermost or innermost.

The grooves 8 and 14 are provided so that the assembly 1 has the least tendency to bend preferentially in one direction, and the least ability to be self-supporting when extending longitudinally.

Figure 4:
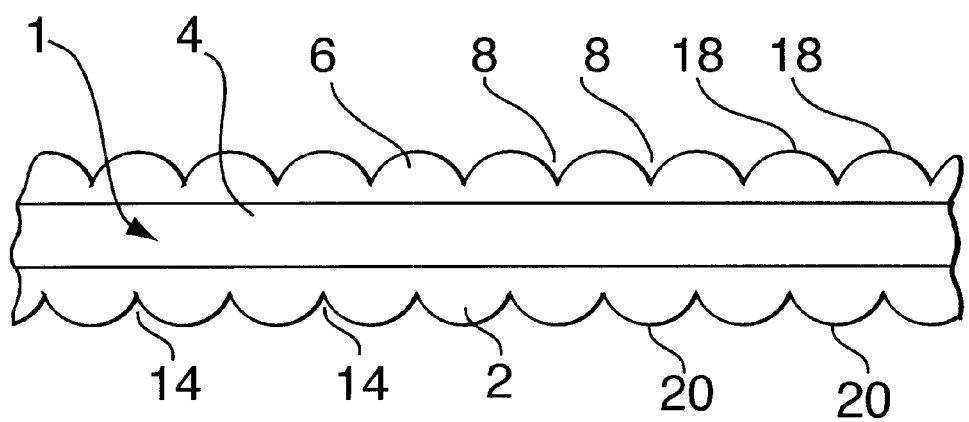
FIGS. 4 to 7 are similar views to FIG. 1, but of different voltaic strip assemblies.
Figure 6:
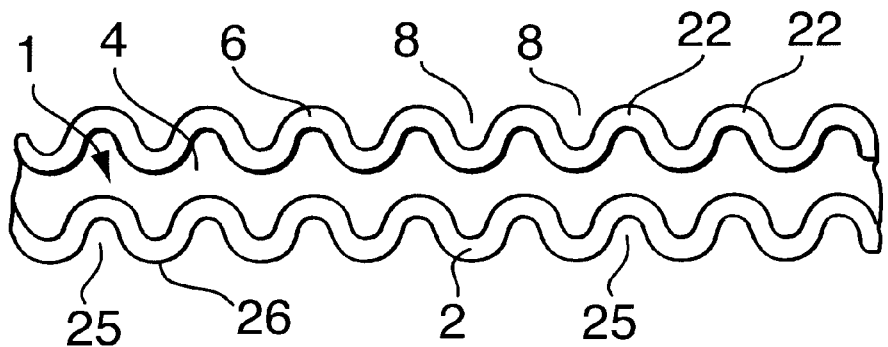

In FIGS. 4 and 6, similar parts to those shown in FIG. 1, are designated by the same reference numerals, and the previous description is relied upon to describe them.

In FIG. 4, the grooves 8 form domes, such as those designated 18, between them, and the grooves 14 form domes, such as those designated 20, between them.

Figure 5:
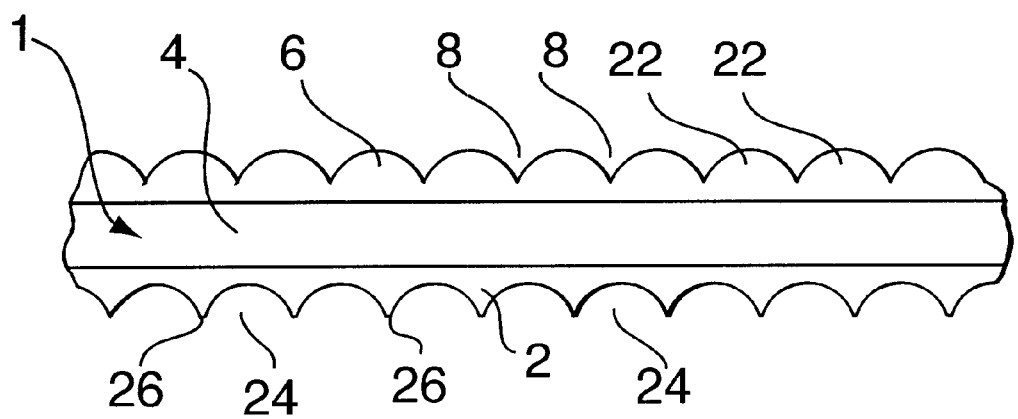

In FIG. 5, the grooves 8 have curved sides to form domes, such as those designated 22, while the substrate 2 is fluted, with flutes such as those designated 24, to receive the domes 22.

In FIG. 6, the grooves 8 have curved sides to form domes such as those designated 22, while the substrate 2 has similar grooves, such as those designated 25, but which are aligned with the domes 22 to receive them. In this embodiment, the voltaic strip 4 has a wavy form to follow the sinuous path between the outer surfaces of the substrate 2 and the protective covering 6.

It should be noted that the ridges, such as those designated 26, formed between the flutes 24, and are preferably truncated to fit in the grooves 8.

Figure 7:
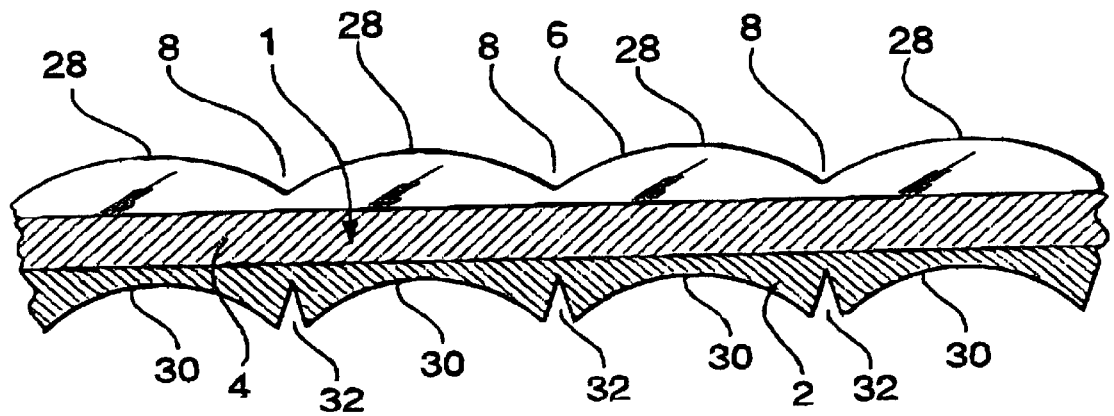
Figure 8:
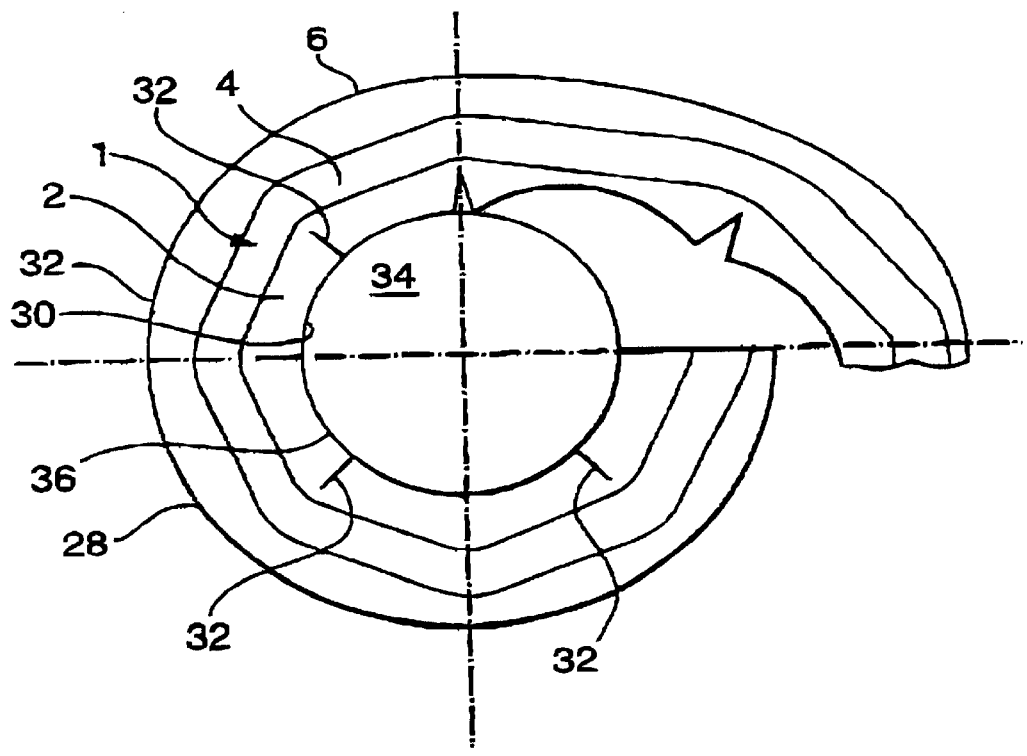
FIG. 8 is an end view of an end portion of the assembly shown in FIG. 7 wound round a rechargeable battery or energy cell.

In FIGS. 7 and 8, similar parts to those shown in FIG. 1 are designated by the same reference numerals, and the previous description is relied upon to describe them.

In FIGS. 7 and 8, the grooves 8 have curved sides to form domes 28, while the flutes 30 have V-shaped notches 32 between them. As shown in FIG. 8, the curvatures of the domes 28 and the flutes 30 are chosen so that when the assembly 1 is coiled around a rechargeable battery or energy cell 34, with the V-shaped notches 32 closed, the flutes closely follow the contour 36 of the exterior of the rechargeable battery or energy cell 34, while the domes 28 provide a more or less continuously curving surface.

The protective covering 8 may also have the desirable effect of directing and entrapping more photons to the surface of the photovoltaic strip 4 than is directed thereto by a protective covering of uniform thickness.

Figure 9:
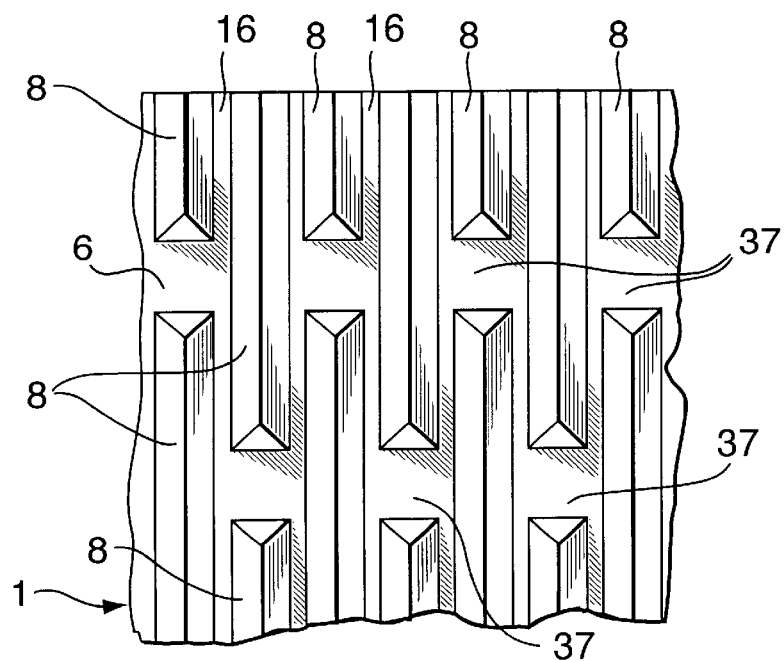
FIG. 9 is a plan view of a portion of a voltaic strip assembly.
Figure 10:
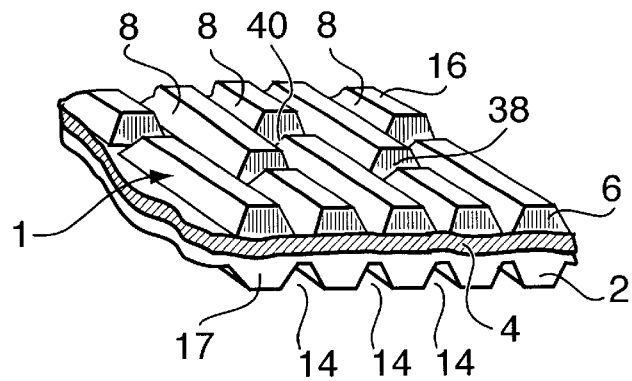
FIGS. 10 and 11 are isometric views of voltaic strip assemblies.
Figure 11:
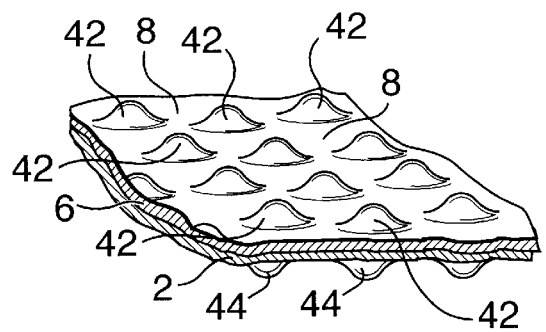

In FIGS. 9 to 11, similar parts to those shown in FIG. 1 are designated by the same reference numerals, and the previous description is relied upon to describe them.

In FIG. 9, the grooves 8 have discontinuities 37 across the assembly 1, and the discontinuities of adjacent grooves 8 are displaced across the strip 1.

The grooves 14 (FIG. 1) may also be discontinuous in the same manner to those shown in FIG. 9 for the protective covering 6.

Providing discontinuities 37 tends to avoid continuous breaks occurring across the voltaic strip 4, which could create electrical discontinuities therealong.

In FIG. 10, the triangular ridges 16 and 17 are discontinuous with breaks, much as those designated 38 and 40. The breaks 38 and 40 are displaced from one another across the assembly.

In FIG. 11, the grooves 8 lie between hump-shaped protuberances 42. The hump-shaped protuberances 42 of adjacent rows preferably, as shown, form quincuncial patterns to distribute bending stresses more evenly in the assembly.

The substrate 2 is preferably also provided with similar hump-shaped protuberances 44.

The protuberances 42 increase the photon absorbing properties of the covering 6.

What is claimed is:

1. A photovoltaic strip assembly, comprising,
   a. a flexible strip substrate of polymeric material having an outer surface, said outer surface of said substrate having a series of transverse, weak joint forming grooves extending thereacross;
   b. a thin film, photovoltaic strip bonded to said substrate; and,
   c. a flexible, transparent, protective covering of polymeric material bonded to said photovoltaic strip and having an outer surface, said outer surface of said protective covering having a series of transverse, weak joint forming grooves extending thereacross, and wherein
   said weak joint forming grooves of said protective covering, and said weak joint forming grooves of said substrate form ridges between the grooves in said outer surface of said protective covering and said outer surface of said substrate, wherein said ridges of said substrate being aligned with said grooves of said protective covering, so that said ridges of said substrate will enter said grooves of said protective covering when said photovoltaic strip assembly is wound into a coil.

2. The assembly of claim 1, wherein said weak joint forming grooves of said protective covering and said weak joint forming grooves of said substrate are trough-shaped in cross-section, so that the ridges of said substrate can enter said grooves of said protective covering at a number of positions thereacross.

3. The assembly of claim 2, wherein said grooves of said protective covering have curved sides to form dome-shaped ridges between the grooves.

4. The assembly of claim 3, wherein said grooves of said outer surface of said substrate have curved sides which form dome-shaped ridges between the grooves.

5. The assembly of claim 3 wherein said grooves in said outer surface of said substrate form a series of inwardly curving flutes extending transversely thereacross, and said flutes are aligned with said dome-shaped ridges on said protective covering so that said dome-shaped ridges will enter said flutes when said photovoltaic assembly is wound into a coil.

6. The assembly of claim 5, wherein said flutes have V-shaped notches between the flutes and said dome-shaped and said flutes are shaped to provide continuous curved surfaces when said photovoltaic assembly is wound into a coil.

7. A photovoltaic strip assembly, comprising,
   a. a flexible strip substrate of polymeric material having an outer surface;
   b. a thin film, photovoltaic strip bonded to said substrate; and,
   c. a flexible, transparent, protective covering of polymeric material bonded to said photovoltaic strip and having an outer surface, said outer surface of said protective covering having a series of transverse, weak joint forming grooves extending thereacross, and wherein
   said grooves are discontinuous across said photovoltaic strip assembly, and discontinuities of adjacent grooves are displaced across the photovoltaic strip assembly.

8. A photovoltaic strip assembly, comprising,
   a. a flexible strip substrate of polymeric material having an outer surface, said outer surface of said substrate having a series of transverse, weak joint forming grooves extending thereacross;
   b. a thin film, photovoltaic strip bonded to said substrate; and,
   c. a flexible, transparent, protective covering of polymeric material bonded to said photovoltaic strip and having an outer surface, said outer surface of said protective covering having a series of transverse, weak joint forming grooves extending thereacross, and wherein
   the grooves in the protective covering and the substrate are discontinuous, and discontinuities of adjacent grooves in both the protective covering and the substrate are displaced across the photovoltaic strip assembly.

9. A photovoltaic strip assembly, comprising,
   a. a flexible strip substrate of polymeric material having an outer surface;
   b. a thin film, photovoltaic strip bonded to said substrate; and,
   c. a flexible, transparent, protective covering of polymeric material bonded to said photovoltaic strip and having an outer surface, said outer surface of said protective covering having a series of transverse, weak joint forming grooves extending thereacross, said grooves lying between rows of hump-shaped protuberances; and wherein
   said protuberances of adjacent rows form quincuncial patterns.

10. A photovoltaic strip assembly, comprising,
    a. a flexible strip substrate of polymeric material having an outer surface, said outer surface of said substrate having a series of transverse, weak joint forming grooves extending thereacross;
    b. a thin film, photovoltaic strip bonded to said substrate; and,
    c. a flexible, transparent, protective covering of polymeric material bonded to said photovoltaic strip and having an outer surface, said outer surface of said protective covering having a series of transverse, weak joint forming grooves extending thereacross, and wherein
    said grooves of both said protective covering and said grooves of said substrate lie between rows of hump-shaped protuberances.

11. The assembly of claim 10, wherein said protuberances of adjacent rows of both said protective covering and said substrate form quincuncial patterns.

* * * * *